United States Patent [19]

Nagata

[11] Patent Number: 4,700,151
[45] Date of Patent: Oct. 13, 1987

[54] MODULATION SYSTEM CAPABLE OF IMPROVING A TRANSMISSION SYSTEM

[75] Inventor: Yoshinori Nagata, Tokyo, Japan
[73] Assignee: NEC Corporation, Tokyo, Japan
[21] Appl. No.: 841,217
[22] Filed: Mar. 19, 1986
[30] Foreign Application Priority Data
  Mar. 20, 1985 [JP] Japan .................................. 60-57138
  Mar. 26, 1985 [JP] Japan .................................. 60-61280
[51] Int. Cl.⁴ ............................................ H03C 3/08
[52] U.S. Cl. ...................................... 332/18; 330/149
[58] Field of Search ..................... 330/149; 375/39, 60, 375/61; 455/63, 110; 328/162, 164; 332/18

[56] References Cited
U.S. PATENT DOCUMENTS
  4,291,277  9/1981  Davis et al. ......................... 330/149

Primary Examiner—Eugene R. Laroche
Assistant Examiner—Robert J. Pascal
Attorney, Agent, or Firm—Schwartz, Jeffery, Schwaab, Mack, Blumenthal & Evans

[57] ABSTRACT

In a modulation system responsive to a system input signal for supplying an amplifier having nonlinearities with a modulated analog signal to make the amplifier produce an amplified output signal, the system input signal conveys a baseband signal having a predetermined sampling rate for reproduction and is sampled into a sequence of sampled signals having a specific rate higher than the predetermined sampling rate. The sampled signal sequence is converted by a random access memory into a sequence of predistorted signals which compensate for the nonlinearities and which are modulated into the modulated analog signal. Each predistorted signal is adaptively modified at the specific rate with reference to the sampled signals and an additional input signal derived from the amplified output signal. When the sampled signal sequence is sampled at the predetermined sampling rate, the predistorted signal sequence may be produced by interpolating each of the sampled signals at the specific rate. The baseband signal may be either a digital signal or an analog one.

13 Claims, 19 Drawing Figures

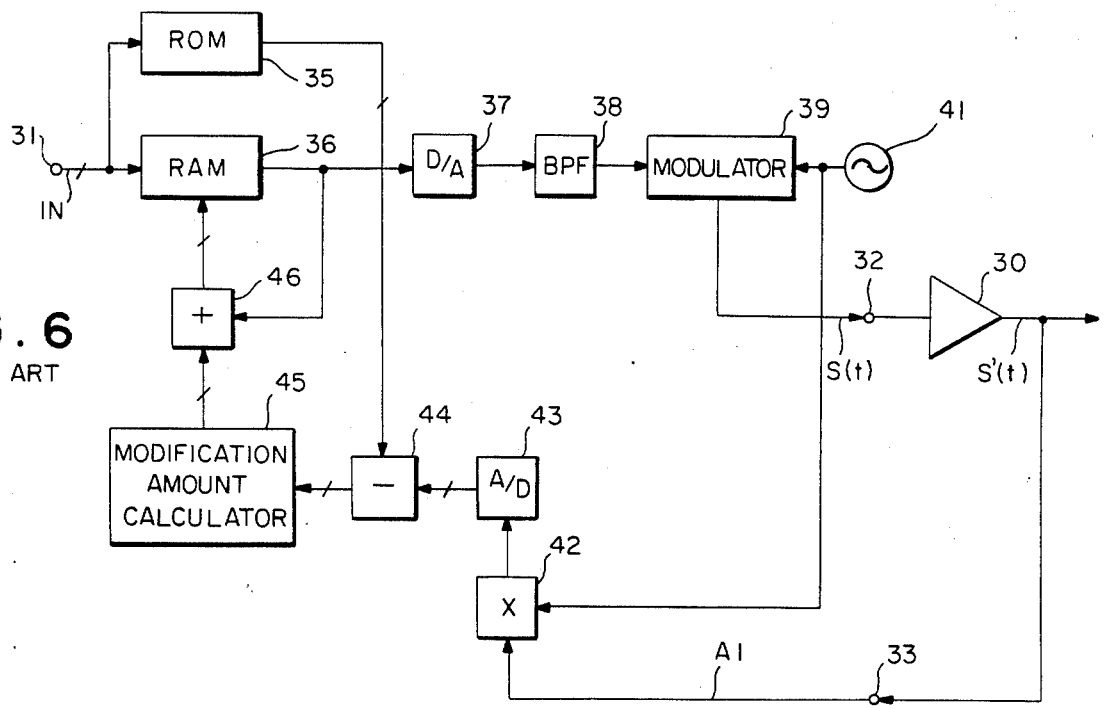
FIG. 6 PRIOR ART
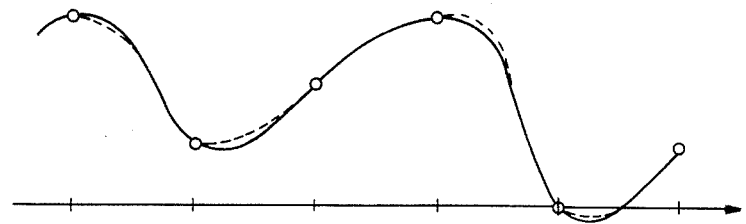
FIG. 7 PRIOR ART
FIG. 8
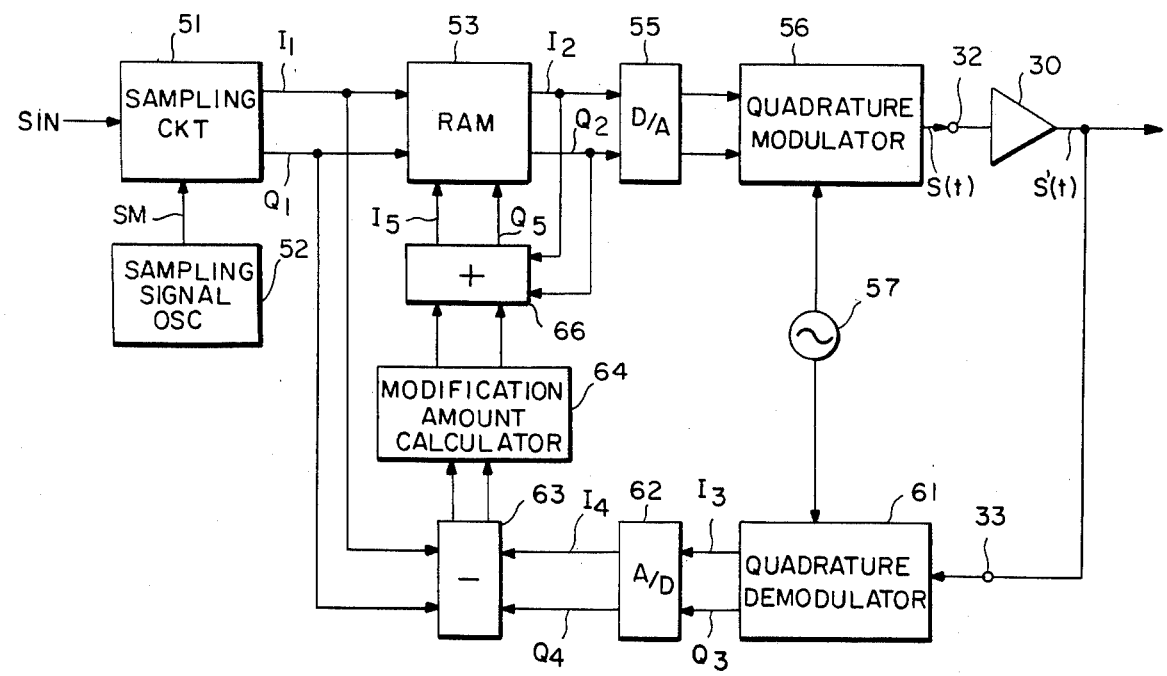

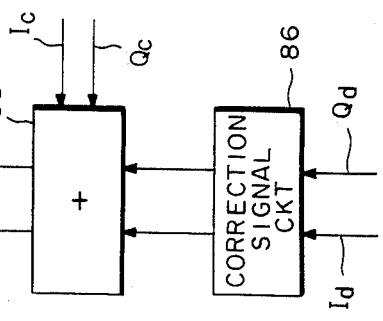
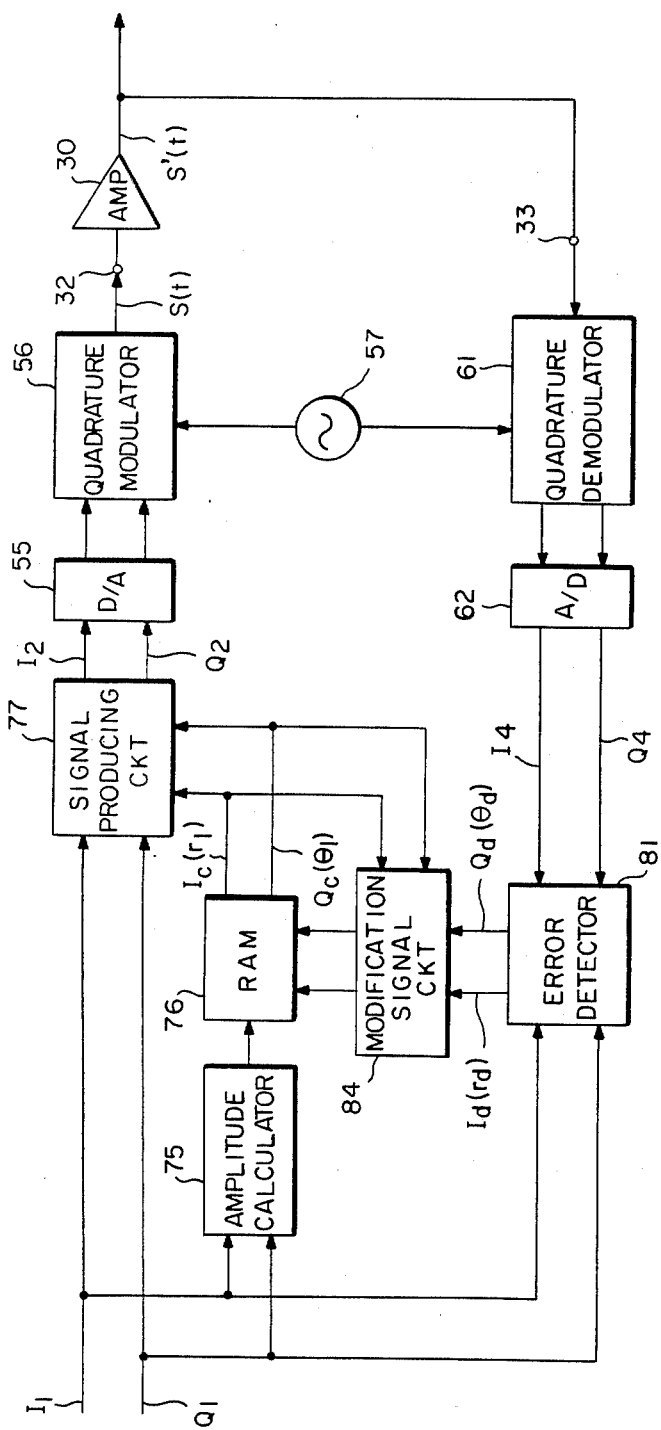
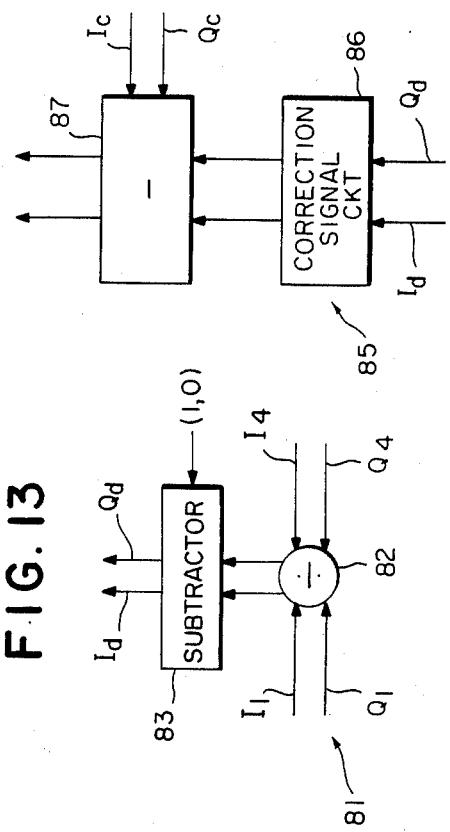
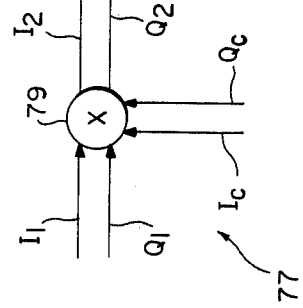
FIG. 11
FIG. 12
FIG. 13
FIG. 14
FIG. 15

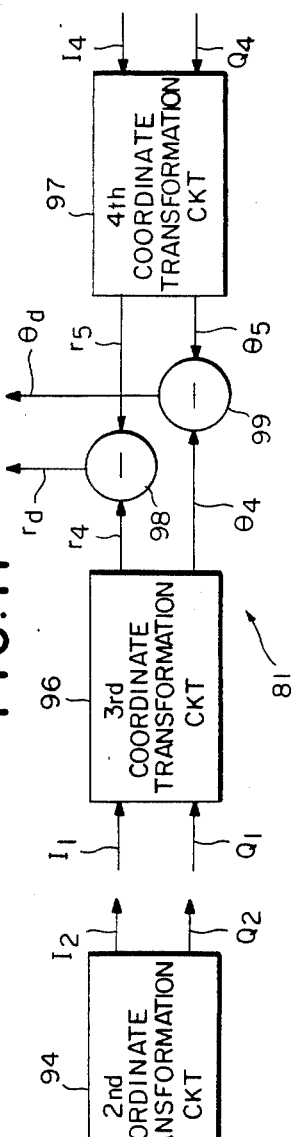
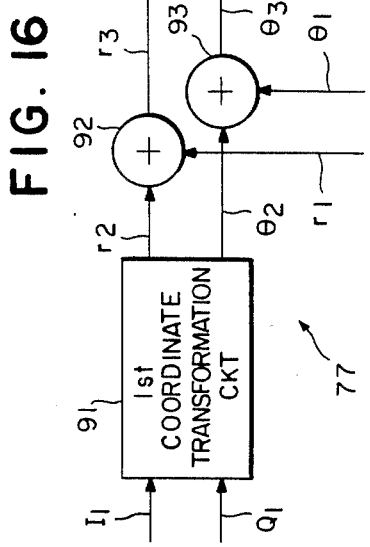
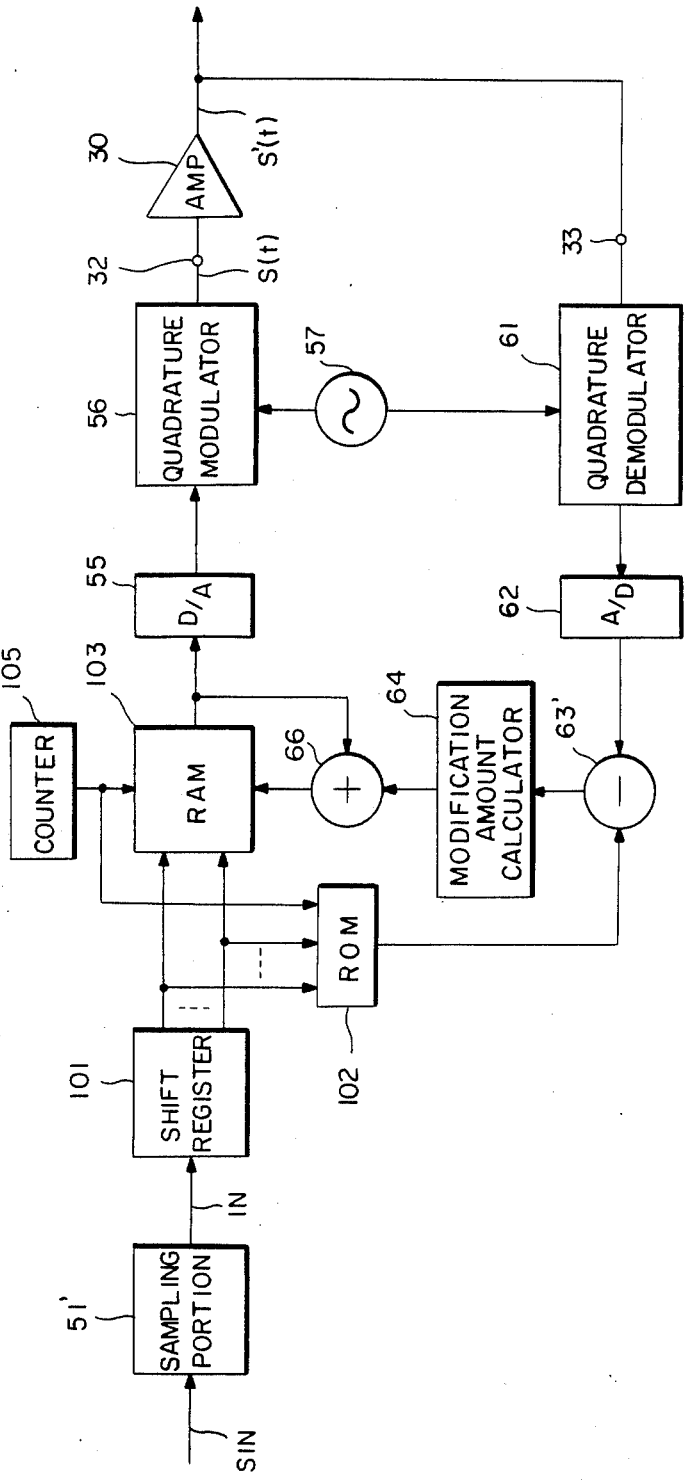

MODULATION SYSTEM CAPABLE OF IMPROVING A TRANSMISSION SYSTEM

BACKGROUND OF THE INVENTION

This invention relates to a modulation system for use in carrying out linear modulation in a radio communication system for digital signal transmission or analog signal transmission. It is to be noted throughout the instant specification that quadrature amplitude-phase modulation is exemplified as the linear modulation employed although this invention is not restricted to the quadrature amplitude-phase modulation.

Recently, deficiency or lack of a radio wave resource, namely, a radio frequency band, has been pointed out and awakens a new interest in narrowing radio frequency bandwidth for each radio channel so as to expedite effective use of the radio frequency band. In the light of narrowing the radio frequency bandwidth for each radio channel, linear modulation is superior to nonlinear modulation, such as frequency modulation, because the latter brings about inevitable expansion of the radio frequency bandwidth for each radio channel.

In general, a modulation system for such linear modulation is for use in combination with an amplifier, such as a solid state power amplifier or a traveling wave tube (TWT) amplifier, which inevitably has nonlinearities in phase and amplitude. The nonlinearities of the amplifier come from nonlinear AM/AM and AM/PM conversion characteristics and give rise to degradation of a transmission spectrum of a transmission signal produced by the amplifier and to deterioration of a reception characteristic of a receiver for receiving the transmission signal. In addition, the nonlinearities cause an intermodulation component to occur and bring about interference between adjacent ones of the radio channels.

As will later be described in conjunction with a figure of the accompanying drawing, an adaptive predistortion circuit is disclosed by Davis et al in U.S. Pat. No. 4,291,277 in order to compensate for the nonlinearities of the amplifier. The adaptive predistortion circuit is placed prior to the amplifier and is supplied with a sequence of digital signals at a symbol rate predetermined for the digital signals and with a sequence of additional digital signals derived from an output signal of the amplifier. In short, the adaptive predistortion circuit is operable to supply the amplifier with a modulated analog signal subjected to predistortion compensating for the nonlinearities. Such predistortion is adaptively carried out with reference to the additional digital signal sequence at the symbol rate.

More particularly, each of the digital signals is delivered as an address signal to a random access memory (RAM) and a read-only memory (ROM). The read-only memory is loaded with a plurality of invariable reference signals while the random access memory is variably loaded with predistorted signals.

Under the circumstances, one of the invariable reference signals is read out of the read-only memory in response to one of the digital signals and is compared with a received one of the additional digital signals to calculate a difference between the one invariable reference signal and the received additional digital signal. On the other hand, one of the predistorted signals is read out of the random access memory in response to the above-mentioned one of the digital signals and is modulated into a modulated analog signal through a modulator to be sent to the amplifier.

Simultaneously, the above-described one of the predistorted signals is adaptively modified into a modified signal with reference to the above-mentioned difference. The modified signal is substituted for the above-described one of the predistorted signals in the random access memory. Thus, the predistorted signals are adaptively updated or modified in consideration of the reference signals and the additional digital signals.

It should be noted that modification of the predistorted signals is carried out at the symbol rate of the digital signal sequence. In other words, the nonlinearities of the amplifier are compensated at every symbol instant of time appearing at the symbol rate and are not compensated during an intermediate time interval between adjacent ones of the symbol instants, both exclusive. Accordingly, the transmission spectrum is not improved during the intermediate time interval and intermodulation is liable to occur during the intermediate time interval.

Moreover, no consideration is paid to analog transmission about application of the modulation system because the teaching of Davis et al is not directed to a relationship between the symbol rate and a sampling rate necessary for sampling an analog signal, such as an audio signal.

SUMMARY OF THE INVENTION

It is an object of this invention to provide a modulation system which is capable of improving a transmission spectrum of transmission signal by compensating for nonlinearities of an amplifier.

It is another object of this inventon to provide a modulation system of the type described, which can compensate for the nonlinearities between an intermediate time between adjacent ones of sampling time instants.

It is still another object of this invention to provide a modulation system of the type described, which is applicable to either digital or analog transmission.

According to this invention, a modulation system is responsive to a system input signal and supplies a modulated analog signal to an amplifier having nonlinearities to make the amplifier produce an amplified output signal. The system input signal conveys an information signal which has a predetermined sampling rate for reproduction. The modulation system comprises preprocessing means responsive to the system input signal and an additional input signal for preliminarily processing the system input signal with reference to the additional input signal to compensate for the nonlinearities at a specific rate higher than the predetermined sampling rate and to produce a sequence of pre-processed signals, modulating means coupled to the pre-processing means for modulating the pre-processed signal sequence into the modulated analog signal, demodulating means responsive to the amplified output signal for demodulating the amplified output signal into a demodulated signal corresponding to the system input signal, and signal supplying means for supplying the demodulated signal to the pre-processing means as the additional input signal.

BRIEF DESCRIPTION OF THE DRAWING

FIG. 6 shows a block diagram of a conventional modulation system together with an amplifier;

FIG. 7 is a time chart for use in describing operation of the conventional modulation system illustrated in FIG. 6;

FIG. 8 shows a block diagram of a modulation system according to a first embodiment of this invention together with the amplifier;

FIG. 11 shows a block diagram of a modulation system according to a third embodiment of this invention;

FIG. 12 is a block diagram of a signal producing circuit for use in the modulation system illustrated in FIG. 11;

FIG. 13 is a block diagram of an error detector for use in the modulation system illustrated in FIG. 11;

FIG. 14 is a block diagram of a modification signal circuit for use in the modulation system illustrated in FIG. 11;

FIG. 15 is a block diagram of another modification signal circuit for use in the modulation system illustrated in FIG. 11;

FIG. 16 is a block diagram of another signal producing circuit applicable to the modulation system illustrated in FIG. 11;

FIG. 17 is a block diagram of another error detector for use in the modulation system illustrated in FIG. 11;

FIG. 18 is a block diagram of a modulation system according to a fourth embodiment of this invention.

DESCRIPTION OF THE PREFERRED EMBODIMENTS

Referring to FIGS. 1 through 5, description will at first be made as regards an influence of an amplifier having nonlinearities, such as a traveling wave tube amplifier, on the assumption that the amplifier follows a conventional modulation system which has no predistortion circuit and which carries out four-by-four quadrature-phase amplitude modulation, namely, 16-QAM.

Figure 1:
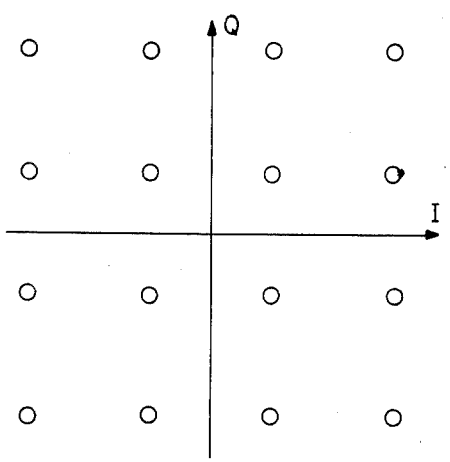
FIG. 1 is a view for use in describing a normal arrangement of signal points on a phase plane.
Figure 2:
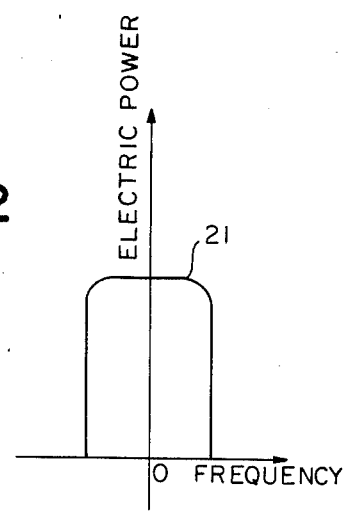
FIG. 2 is a graphical representation of a frequency characteristic resulting from the normal arrangement illustrated in FIG. 1.

As shown in FIG. 1, sixteen signal points are regularly placed on a phase plane defined by an in-phase axis I and a quadrature phase axis Q, if the amplifier had no nonlinearities. Specifically, the sixteen signal points are arranged on the phase plane in a rectangular shape and placed at normal or regular positions. The illustrated signal points may be referred to as normal signal points. In this event, a transmission spectrum has a distribution as shown in FIG. 2 by a curve 21 specified by a frequency versus electric power characteristic. The distribution of the transmission spectrum is sharply cut off when the spectrum is restricted by a Nyquist filter to a predetermined bandwidth, insofar as nonlinearities are absent in the amplifier.

Figure 3:
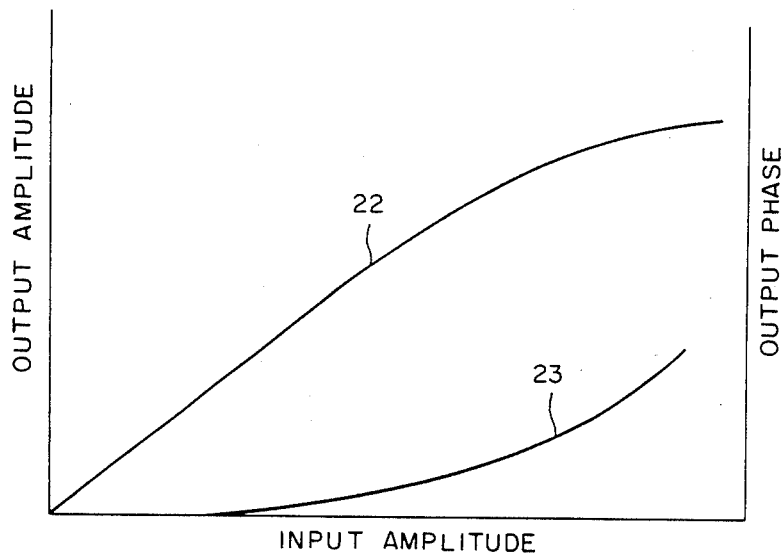
FIG. 3 is a graphical representation for use in describing nonlinearities of an amplifier.

In FIG. 3, the nonlinearities of the amplifier are shown by curves 22 and 23. The curve 22 represents an input amplitude versus output amplitude characteristic which may be referred to as an AM/AM conversion characteristic while the curve 23 represents an input amplitude versus output phase characteristic which may be referred to as an AM/PM conversion characteristic. Each of the curves 22 and 23 is linearly varied when the input amplitude is extremely smaller than a saturation point.

However, as the input amplitude approaches the saturation point, the output amplitude is saturated and the output phase is nonlinearly changed. This results in deterioration of the transmission spectrum and the reception characteristic.

Figure 4:
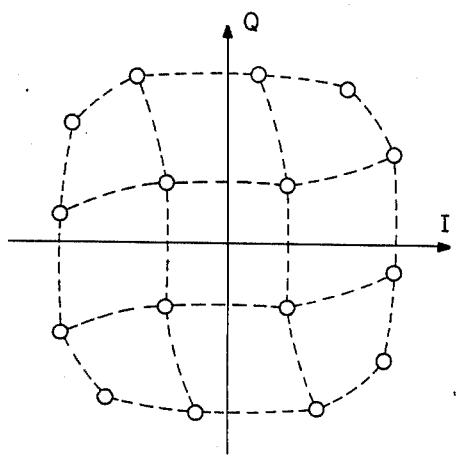
FIG. 4 is a view for use in describing a distorted arrangement of signal points on a phase plane.
Figure 5:
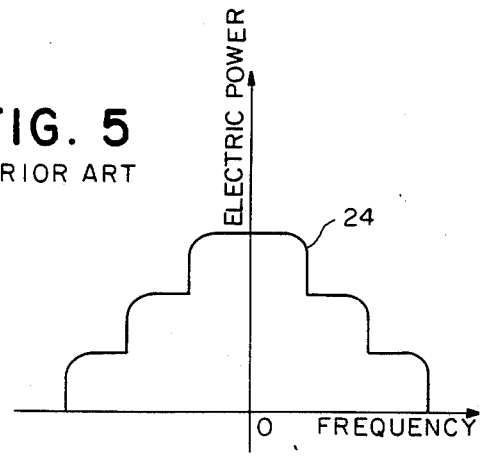
FIG. 5 is a graphical representation of a frequency characteristic resulting from the distorted arrangement illustrated in FIG. 3.

More particularly, the sixteen signal points on the phase plane are displaced in a manner as shown in FIG. 4 when an operating level of the amplifier is adjacent to the saturation point. Distribution or displacement of the signal points which is illustrated in FIG. 4 is deformed in comparison with normal distribution illustrated in FIG. 1. When the distribution of the signal points is deformed in the manner illustrated in FIG. 4, intermodulation components of odd number orders, such as a third-order, fifth-order, etc. inevitably appear due to the deformation of the distribution. Such intermodulation components give rise to an expansion of the transmission spectrum as shown by curve 24 in FIG. 5 and introduce an interference into an adjacent channel or channels.

Responsive to a transmission signal having the distribution of the signal points as illustrated in FIG. 4, a receiver carries out demodulation, on the assumption that the signal points are distributed on the phase plane in the manner illustrated in FIG. 1. Under the circumstances, errors might frequently occur in the receiver. Consequently, the reception characteristic is deteriorated in the receiver.

Referring to FIG. 6, a conventional modification system is placed prior to an amplifier 30 having nonlinearities in phase and amplitude and supplies a modulated analog signal s(t) to the amplifier 30. As a result, the amplifier 30 produces an amplified output signal s'(t) subjected to distortion resulting from the nonlinearities. The illustrated modification system has a system input terminal 31, a system output terminal 32, and an additional input terminal 33. The system input terminal 31 is supplied with an input signal IN at a predetermined symbol rate. The input signal IN is composed of a plurality of parallel bits, as suggested by a slash, and is delivered to a read-only memory (ROM) 35 and a random access memory (RAM) 36 as an address signal.

The read-only memory 35 is loaded with a plurality of digital signals representative of the signal points which are arranged on the phase plane in the manner illustrated in FIG. 1. Accordingly, the digital signals specify the normal signal points and are stored in the read-only memory 35 as complex numbers, respectively. Such digital signals may therefore be referred to as reference digital signals.

On the other hand, the random access memory 36 is initially loaded with a plurality of predistorted signals determined in consideration of the nonlinearities of the amplifier 30. The predistorted signals are stored in the form of complex numbers and adaptively varied in a manner to be described later. Each of the predistorted signals is representative of a predistorted signal point such that the amplified output signal s'(t) will eventually indicate the normal signal points.

Each predistorted signal is read out of the random access memory 36 in response to the input signal IN and is sent through a digital-to-analog converter (D/A) 37 and a band pass filter (BPF) 38 to a modulator 39. The modulator 39 carries out quadrature-phase modulation and may therefore be named a quadrature modulator. To this end, the modulator 39 is supplied with a carrier signal from an oscillator 41 to send the modulated analog signal s(t) to the amplifier 30 through the output terminal 32.

The amplified output signal s'(t) is delivered to an external element (not shown) and is simultaneously partly fed back to a demodulator 42 as an additional input signal AI through the additional input terminal 33. The demodulator 42 carries out quadrature-phase demodulation of the additional input signal AI in response to the carrier signal given from the oscillator 41. A demodulated analog signal is delivered from the demodulator 42 through an analog-to-digital converter 43 to be converted into an additional digital signal of the predetermined number of bits. The additional digital signal is representative of a complex number like each of the reference digital signals and will be called an additional input signal.

Responsive to the additional digital signal and one of the reference digital signals read out of the read-only memory 35, a substractor 44 subtracts the additional digital signal from the one reference digital signal to supply a modification amount calculator 45 with a difference signal representative of a result of subtraction, namely, a difference between the additional and the one reference digital signals. The modification amount calculator 45 multiplies the result of subtraction by a factor k which is sufficiently smaller than unity to produce a product signal representative of a product of the factor k and the result of subtraction.

The product signal is added in an adder 46 to one of the predistorted signals read out of the random access memory 36 to be sent to the random access memory 36 as a write-in signal. As a result, the above-mentioned one predistorted signal is rewritten or updated into the write-in signal. Thus, the one predistorted signal is adaptively varied each time when the product signal is produced by the modification amount calculator 45. Such a product signal is therefore representative of a modification amount of each predistorted signal and may be called a modification amount signal.

With this structure, control operation is carried out so that each predistorted signal becomes small when the additional input signal AI is greater than the reference digital signal. Otherwise, control operation is carried out so that each predistorted signal becomes large.

According to this control operation, it is possible to adaptively control the contents, namely, the predistorted signals of the random access memory 36 so that the normal signal points (FIG. 1) are indicated by the additional input signal AI, namely, the amplified output signal s'(t), even if the nonlinearities vary in the amplifier 30.

It may be mentioned here that the above-mentioned control operation is repeated at every symbol rate and that the random access memory 36 produces the predistorted signals at every symbol rate. Accordingly, each of the predistorted signals is modified only at every symbol time instant and is not modified during a time interval between two adjacent time instants.

Referring to FIG. 7, the band pass filter 38 (FIG. 6) produces a filter output signal having a locus as shown by a broken line. The filter output signal is modified at every symbol time instant as indicated by small circles. Each symbol may therefore take a normal value at every symbol time instant.

However, the locus of the filter output signal is not coincident between two adjacent symbol time instants with a normal locus shown by a real line. This is because no modification of the filter output signal is carried out during a time interval. Therefore, the transmission spectrum is not improved between two adjacent time instants, as pointed out in the background section of the instant specification.

Referring to FIG. 8, a modulation system according to a first embodiment of this invention is supplied with a system input signal SIN which may be an analog signal preliminarily subjected to band restriction by a smoothing circuit (not shown). The system input signal SIN may carry, as an information signal, either a pair of parallel digital signals or an analog signal, such as an audio signal. The analog signal may be subjected to amplitude modulation so as to appear in a single side band. Such an information signal is divided into an in-phase component a(t) and a quadrature phase component b(t). For example, when single side band transmission is applied to transmit the audio signal, it is well known in the art that the in-phase component a(t) is representative of the audio signal while the quadrature phase component is representative of a signal into which the in-phase component is converted by Hilbert conversion. The information signal may be called a baseband signal falling within a preselected signal band and be given by:

$$a(t)+jb(t). \qquad (1)$$

It is mentioned here that the information signal can be reproduced by sampling the system input signal at a predetermined sampling rate determined by the preselected signal band of the information signal, namely, the baseband signal, in the manner known in the art. The predetermined sampling rate may be regarded as a minimum sampling rate necessary for reproducing the information signal. The predetermined sampling rate is therefore equal to twice the signal band when the audio signal is carried by the system input signal SIN. On the other hand, the predetermined sampling rate is equal to the symbol rate when the digital signal pair is conveyed by the system input signal SIN.

For brevity of description, it will be assumed that the system input signal SIN conveys a pair of parallel digital signals each of which is produced at a symbol rate corresponding to the predetermined sampling rate.

The illustrated modification system is for delivering a modulated analog signal s(t) to the amplifier 30 in response to the system input signal SIN. The modulated analog signal s(t) is given with reference to Equation (1) by:

$$s(t)=Re\{(a(t)+jb(t))\cdot\exp(j2\pi f_c t)\}, \qquad (2)$$

where $f_c$ is representative of the carrier frequency. When the modulated analog signal s(t) passes through the amplifier 30 having the nonlinearities, the amplifier 30 produces an amplified output signal s'(t) given by:

$$s'(t) = Re\{F(a(t)+jb(t))\cdot \exp(j2\pi f_c t)\}, \quad (3)$$

where $F(a(t)+jb(t))$ is a function representative of the nonlinearities shown in FIG. 3.

Such nonlinearities can be removed by the use of a function $G(x)$ satisfying the following equation.

$$F(G(a(t)+jb(t))) = a(t)+jb(t). \quad (4)$$

Under the circumstances, the illustrated modulation system realizes the function $G(x)$ and makes the amplifier 30 produce the amplifier output signal $s'(t)$ having no deformation of the signal points.

In FIG. 8, the system input signal SIN is fed to a sampling circuit 51 operable in response to a sampling signal SM of a specific sampling rate supplied from a sampling signal oscillator 52. It is to be noted here that the specific sampling rate is higher than the symbol rate. For instance, when the specific sampling rate is equal to or greater than four times the predetermined sampling rate, it is possible to sufficiently reduce a third-order component of distortion. Likewise, it is possible to satisfactorily diminish distortion components up to a fifth-order component of distortion when the specific sampling rate is equal to or greater than six times the predetermined sampling rate. This applies to the case where the audio signal is carried by the system input signal SIN.

A sequence of sampled signals is delivered as an address signal in the manner described in conjunction with FIG. 6 from the sampling circuit 51 to a random access memory (RAM) 53 which stores a plurality of predistorted signals. The predistorted signals are produced in accordance with a conversion table for converting $a(t)+jb(t)$ into $G(a(t)+jb(t))$. The conversion table is adaptively renewed in a manner to be described later.

The random access memory 53 serves to directly convert $a(t)+jb(t)$ into $G(a(t)+jb(t))$.

More particularly, the sampled signal sequence is composed of a sequence of in-phase sampled signals $I_1$ and a sequence of quadrature phase sampled signal $Q_1$. The in-phase sampled signal sequence $I_1$ and the quadrature phase sampled signal sequence $Q_1$ are representative of the in-phase and the quadrature phase components, respectively.

Inasmuch as the predistorted signals are stored in the random access memory 53 so as to compensate for the nonlinearities of the amplifier 30 in a manner similar to that described in conjunction with FIG. 6, one of the predistorted signals is read out of the random access memory 53 in response to the sampled signal sequence. The afore-mentioned one predistorted signal may be referred to as a current predistorted signal for convenience of description. In the example being illustrated, the current predistorted signal is composed of an in-phase predistorted signal $I_2$ and a quadrature phase predistorted signal $Q_2$ which may be called a current in-phase predistorted signal and a current quadrature predistorted signal, respectively.

Figure 9:
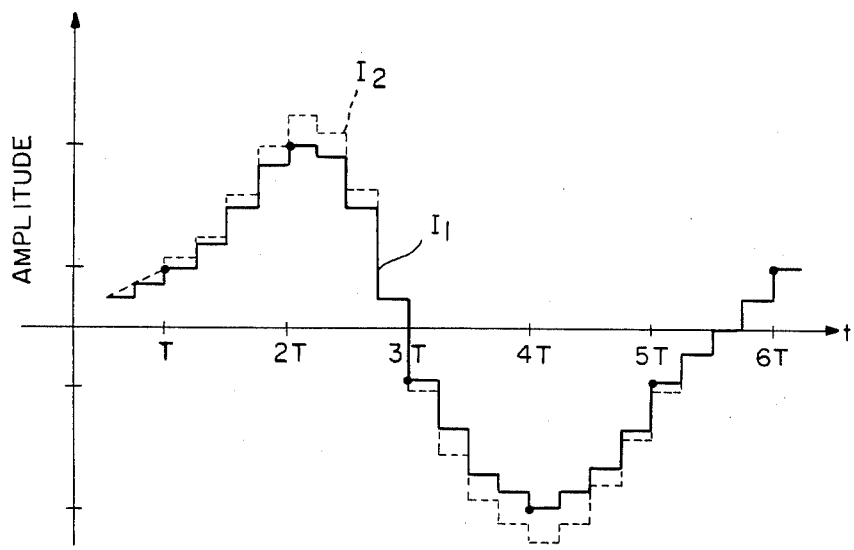
FIG. 9 is a time chart for use in describing operation of the modulation system illustrated in FIG. 8.

Referring to FIG. 9, the in-phase sampled signal sequence $I_1$ is exemplified by a solid line while the in-phase predistorted signal sequence $I_2$ is produced from the random access memory 53 in response to the in-phase sampled signal sequence $I_1$, as illustrated by a broken line. In the example being illustrated in FIG. 9, the in-phase sampled signal sequence conveys the baseband signal which is to be sampled at a period T determined by the symbol rate, as symbolized by dots. The period T may be called a symbol interval. It will readily be understood from FIG. 9 that the in-phase sampled signal is sampled at the specific sampling rate which is equal to four times the symbol rate. As a result, the in-phase predistorted signal sequence appears at the specific sampling rate. A similar relationship holds between the quadrature phase sampled signal sequence $Q_1$ and the quadrature phase predistorted signal sequence $Q_2$.

Referring back to FIG. 8, the in-phase and the quadrature phase predistorted signals $I_2$ and $Q_2$ are sent as a sequence of preprocessed signals to a digital-to-analog converter 55 to be converted into a pair of analog signals from which the third-order component of distortion is removed. The analog signal pair is sent to a quadrature modulator 56 to be subjected to quadrature modulation. In order to carry out quadrature-phase modulation, the quadrature modulator 56 is supplied with a carrier signal from an oscillator 57 and delivers a modulated analog signal $s(t)$ through the system output terminal 32 to the amplifier 30. The amplified output signal $s'(t)$ is delivered to an external element (not shown) and is partly fed back through the additional input terminal 33 to a quadrature demodulator 61 which is supplied with the carrier signal from the oscillator 57.

The quadrature demodulator 61 demodulates the amplified output signal $s'(t)$ fed back from the amplifier 30 into a demodulated signal corresponding to the system input signal SIN. The demodulated signal is composed of an in-phase demodulated component $I_3$ and a quadrature phase demodulated signal $Q_3$ in the modulation system illustrated in FIG. 8 and is sent to an analog-to-digital converter 62. The demodulated signal is representative of a baseband signal similar to that conveyed by the system input signal SIN.

The analog-to-digital converter 62 converts the in-phase demodulated signal $I_3$ and the quadrature phase demodulated signal $Q_3$ into an in-phase demodulated digital signal $I_4$ and the quadrature phase demodulated digital signal $Q_4$ at a rate equal to the specific sampling rate, respectively. Both the in-phase and the quadrature phase demodulated digital signals $I_4$ and $Q_4$ are delivered to a subtractor 63 as an additional input signal. From this fact, it is seen that the additional input signal is sent to the subtractor 63 at the rate which is equal to four times the predetermined sampling rate.

It is to be noted here that the illustrated subtractor 63 is supplied with the sampled signals in addition to the additional input signal and that a read-only memory shown in FIG. 6 is not used in the modification system. More particularly, the subtractor 63 subtracts the in-phase and the quadrature phase demodulated digital signals $I_4$ and $Q_4$ from the in-phase and the quadrature phase sampled signals $I_1$ and $Q_1$, respectively. The subtractor 63 produce first and second result signals representative of results of subtraction between the in-phase sampled signal $I_1$ and the in-phase demodulated digital signal $I_4$ and, between the quadrature phase sampled signal $Q_1$ and the quadrature phase demodulated digital signal $Q_4$, respectively.

If the random access memory 53 normally converts the in-phase and the quadrature phase sampled signals $I_1$ and $Q_1$ into the in-phase and the quadrature phase predistorted signals $I_2$ and $Q_2$, each of the first and the second result signals becomes equal to zero.

If each of the first and the second result signals is not equal to zero, a modification amount calculator 64 multiplies the first and the second result signals by a factor p which is smaller than unity. The modification amount calculator 62 thereby produces calculator output signals representative of the modification amount, respectively. The calculator output signals are added in an adder 66 to the in-phase and the quadrature phase predistorted signals $I_2$ and $Q_2$ to be sent to the random access memory 53 as first and second write-in signals $I_5$ and $Q_5$, respectively. The first and second write-in signals $I_5$ and $Q_5$ are produced by modifying the current predistorted signals and may be named modified signals. As a result, the current in-phase and the current quadrature phase predistorted signals $I_2$ and $Q_2$ are rewritten into the respective write-in signals $I_5$ and $Q_5$.

In the subtractor 63, the in-phase and the quadrature phase sampled signals $I_1$ and $Q_1$ may be subtracted from the in-phase and the quadrature phase demodulated digital signals $I_4$ and $Q_4$, respectively, instead of subtraction of the demodulated digital signals $I_4$ and $Q_4$ from the sampled signals $I_1$ and $Q_1$. In this event, a subtractor should be substituted for the adder 66 to calculate a difference between the calculator output signals and the predistorted signals $I_2$ and $Q_2$.

As mentioned above, the system input signal SIN is processed prior to modulation with reference to the additional input signal $I_4$ and $Q_4$ by the use of a combination of the sampling circuit 51, the sampling signal oscillator 52, the random access memory 53, the subtractor 63, the modulation amount calculator 64, and the adder (or subtractor) 66. Accordingly, the above-mentioned combination may be named a pre-processing circuit for preliminarily processing the system input signal SIN to compensate for the nonlinearities of the amplifier 30 and to produce the pre-processed signal sequence.

In addition, a combination of the subtractor 63 and the modification amount calculator 64 may be called a first calculating circuit for successively calculating differences, namely, the results of subtraction between the sampled signals and the additional input signals while the adder 66 and the random access memory 53 may be referred to as a second calculating circuit for adaptively calculating the pre-processed signals which are subjected to predistortion. In this sense, the random access memory 53, the subtractor 63, the modification amount calculator 64, and the adder 66 may be referred to as a predistorting circuit for compensating for the nonlinearities of the amplifier 30 at a specific rate which is equal to the specific sampling rate and which is therefore higher than the predetermined sampling rate.

Figure 10:
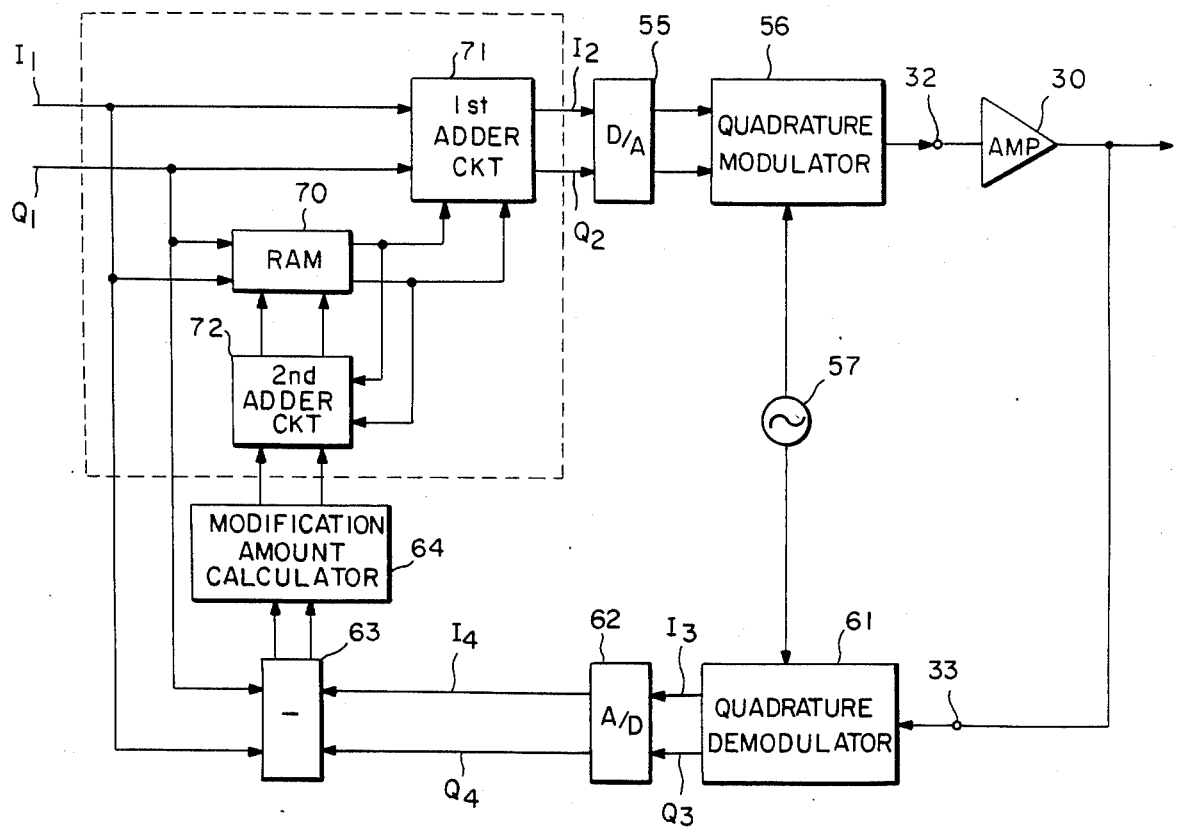
FIG. 10 shows a block diagram of a modulation system according to a second embodiment of this invention.

Referring to FIG. 10, a modulation system according to a second embodiment of this invention comprises a random access memory 70, a first adder circuit 71, and a second adder circuit 72, which are surrounded by a broken-line rectangle. The remaining parts are similar to that illustrated in FIG. 8 and will not be described.

In FIG. 10, the in-phase and the quadrature phase sampled signals $I_1$ and $Q_1$ are delivered to both the random access memory 70 and the first adder circuit 71 and to the subtractor 63. The illustrated random access memory 70 is loaded with a plurality of distortion components which are given by:

$$G(a(t)+jb(t))-(a(t)+jb(t)), \qquad (5)$$

where the in-phase and the quadrature phase sampled signals $I_1$ and $Q_1$ are represented by $a(t)$ and $b(t)$, respectively. In other words, the random access memory 70 stores a conversion table for converting a current one of the sampled signals into one of the distortion components represented by the formula (5). The one deformation component is divisible into an in-phase and a quadrature phase distortion component and may be called a current deformation component. The current distortion component is sent to the first adder circuit 71 to be added to the current sampled signal. As a result, the first adder circuit 71 produces the predistorted signals which are represented by $G(a(t)+jb(t))$ and which are sent to the digital-to-analog converter 55 as the in-phase and the quadrature phase predistorted signals $I_2$ and $Q_2$ which are similar to those illustrated in conjunction with FIG. 8.

Simultaneously, the current distortion component is sent to the second adder circuit 72 coupled to the modification amount calculator 64. Like in FIG. 8, the calculator output signals are calculated in the manner mentioned in connection with FIG. 8 and are added to the current distortion component in the second adder circuit 72 to be delivered to the random access memory 70 as a write-in signal representative of the modification amount which is to be substituted for the current distortion component. Thus, the current distortion component is adaptively rewritten into the write-in signal.

The distortion components have amplitudes smaller than those of the sampled signals and can be represented by a small number of quantization levels in comparison with the sampled signals. Therefore, the random access memory 70 may have a memory capacity which is smaller than that of the random access memory 53 illustrated in FIG. 8.

As described in conjunction with FIG. 8, the subtractor 63 may subtract the sampled signals $I_1$ and $Q_1$ from the demodulated digital signals $I_4$ and $Q_4$ instead of subtraction of the demodulated digital signals $I_4$ and $Q_4$ from the sampled signals $I_1$ and $Q_1$.

Referring to FIG. 11, a modification system according to a third embodiment of this invention predistorts the in-phase and the quadrature phase sampled signals $I_1$ and $Q_1$ by the use of the fact that the nonlinearities can be determined by an amplitude of the baseband signal $a(t)+jb(t)$. For this purpose, the in-phase and the quadrature phase sampled signals $I_1$ and $Q_1$ are delivered to an amplitude calculator 75 for successively calculating an amplitude of the baseband signal to produce an amplitude signal representative of a quantized value of the amplitude. The amplitude signal is sent to a random access memory 76 for storing a plurality of compensation signals for compensating for the nonlinearities of the amplifier 30. Each of the compensation signals is represented by a complex representation and is given by:

$$G(a(t)+jb(t))/(a(t)+jb(t)). \qquad (6)$$

Each compensation signal can be expressed either by an orthogonal coordinate representation or by a polar coordinate representation.

At first, it will be assumed that the orthogonal coordinate representation is used to express the compensation signals. In this connection, each of the compensation signals may be divided into an in-phase compensation component $I_c$ and a quadrature phase compensation component $Q_c$.

Referring to FIG. 12 together with FIG. 11, the compensation signals are delivered to a signal producing circuit 77 supplied with the in-phase and the quadrature phase sampled signals $I_1$ and $Q_1$. As shown in FIG.

12, the signal producing circuit 77 comprises a multiplier 79 for multiplying the compensation signals by the sampled signals to produce predistorted signals specified by in-phase and quadrature phase predistorted signals $I_2$ and $Q_2$. Inasmuch as the sampled signals $I_1$ and $Q_1$ carry the baseband signal represented by Equation (1) and the compensation signals $I_c$ and $Q_c$ are represented by Formula (6), the predistorted signals $I_2$ and $Q_2$ become equal to $G(a(t)+jb(t))$, like in FIGS. 8 and 10.

In FIG. 11, the in-phase and the quadrature phase predistorted signals $I_2$ and $Q_2$ are subjected to quadrature modulation and amplification in the manner mentioned in conjunction with FIGS. 8 and 10. The amplified output signal $s'(t)$ is partly sent through the quadrature demodulator 61 and the analog-to-digital converter 62 to an error detector 81 as the in-phase and the quadrature phase demodulated digital signals $I_4$ and $Q_4$ which may be collectively called the additional input signal.

Referring to FIG. 13 afresh and FIG. 11 again, the error detector 81 is operable in response to the sampled signals $I_1$ and $Q_1$ and to the additional input signal to produce a difference signal which is representative of a difference therebetween and which is composed of an in-phase difference component $I_d$ and a quadrature difference component $Q_d$. As shown in FIG. 13, the error detector 81 comprises a divider 82 supplied with the additional input signal as a dividend and with the sampled signals as a divisor. The divider 82 carries out division between complex numbers to produce a quotient signal representative of a quotient of a complex number and composed of an in-phase quotient signal and a quadrature phase quotient signal.

The quotient signal is delivered to a subtractor 83 for subtracting unity from the in-phase and the quadrature phase quotient signals. The in-phase and the quadrature phase difference components $I_d$ and $Q_d$ are fed to a modification signal circuit 84. Alternatively, the in-phase and the quadrature phase quotient signals may pass through the subtractor 83 as the difference signals without any subtraction, as suggested by zero in FIG. 13.

Referring to FIG. 14 in addition to FIG. 11, the modification signal circuit 85 is for use in combination with the error detector 81 comprising the subtractor 83 for carrying out subtraction of unity from the quotient signal. The illustrated modification signal circuit 85 comprises a correction signal circuit 86 similar to the modification amount calculator 64 (FIGS. 8 and 10) and a subtractor 87 coupled to the random access memory 76 (FIG. 11).

Responsive to the difference signals $I_d$ and $Q_d$, the correction signal circuit 86 multiplies the difference signals $I_d$ and $Q_d$ by the above-mentioned factor p to supply circuit output signals to the subtractor 87. The subtractor 87 is given the compensation components $I_c$ and $Q_c$ and subtracts the circuit output signals from the compensation signals $I_c$ and $Q_c$ to store results of subtraction into the random access memory 76 as the write-in signals. Thus, the predistorted signals are adaptively updated by the write-in signals. Such operation is carried out at the specific rate mentioned in conjunction with FIG. 8.

Referring to FIG. 15 together with FIG. 11, the modification signal circuit 86 illustrated in FIG. 15 is for use in combination with the error detector 81 in which the quotient signals are directly produced as the difference signals without any subtraction. In this event, an adder 88 is substituted for the subtractor 87 (FIG. 14) and adds the circuit output signals of the correction signal circuit 86 to the compensation signals $I_c$ and $Q_c$.

It will now be assumed that the polar coordinate representation is used to express the compensation signals stored in the random access memory 76 illustrated in FIG. 11. In this case, it is necessary to somewhat change the signal producing circuit 77 (FIG. 12) and the error detector 81 (FIG. 13).

Referring to FIG. 16, a signal producing circuit 77 is operable in response to the compensation signals which are expressed by the polar coordinate representation. Each of the compensation signals is therefore divided into first and second components $r_1$ and $\theta_1$ representative of an amplitude and a phase of distortion, respectively.

However, it is to be noted that the sampled signals $I_1$ and $Q_1$ are not expressed by the polar coordinate representation but the orthogonal coordinate representation. The in-phase and the quadrature phase sampled signals $I_1$ and $Q_1$ are therefore subjected to coordinate transformation by a first coordinate transformation circuit 91 so as to transform the orthogonal coordinate representation into the polar coordinate representation. As a result, the first coordinate transformation circuit 91 produces an amplitude signal $r_2$ and a phase signal $\theta_2$ which are representative of the baseband signal carried by the sampled signals $I_1$ and $Q_1$, respectively, and will be named an input amplitude signal and an input phase signal, respectively.

An adder circuit 92 adds the first component $r_1$ to the input amplitude signal $r_2$ to calculate a first sum signal $r_3$. As mathematically proved, the first sum signal $r_3$ is representative of an amplitude component of a compensated signal in which the nonlinearities are compensated. Likewise, an additional adder circuit 93 adds the second component $\theta_1$ to the input phase signal $\theta_2$ to calculate a second sum signal $\theta_3$ representative of a phase component of the compensated signal.

The first and second sum signals $r_3$ and $\theta_3$ are subjected to coordinate transformation by a second coordinate transformation circuit 94 and converted into the in-phase and the quadrature phase predistorted signals $I_2$ and $Q_2$, respectively. A multiplier circuit may be substituted for the adder circuit 92.

Referring to FIG. 17, the error detector 81 is modified for use in combination with the random access memory 76 which produces the first and the second components $r_1$ and $\theta_1$ expressed by the polar coordinate representation. The in-phase and the quadrature phase sampled signals $I_1$ and $Q_1$ are converted by a third coordinate transformation circuit 96 into an amplitude signal $r_4$ and a phase signal $\theta_4$ of the polar coordinate representation in the manner described in conjunction with the first coordinate transformation circuit 91. Likewise, the in-phase and the quadrature phase demodulated digital signals $I_4$ and $Q_4$ are also converted by a fourth coordinate transformation circuit 97 into an amplitude signal $r_5$ and a phase signal $\theta_5$ of the polar coordinate representation.

A subtractor 98 subtracts the amplitude signal $r_5$ from the amplitude signal $r_4$ to produce an amplitude error signal $r_d$. Similarly, a subtractor 99 subtracts the phase signal $\theta_5$ from the phase signal $\theta_4$ to produce a phase error signal $\theta_d$. Thus, each of the subtractors 98 and 99 subtracts an output signal of the fourth coordinate transformation circuit 97 from an output signal of the third coordinate transformation circuit 96. The amplitude and the phase error signals $r_d$ and $\theta_d$ are sent to the modification signal circuit 84 which may be similar in structure to that illustrated in FIG. 14.

Alternatively, each of the subtractors 98 and 99 may subtract the output signal of the third coordinate transformation circuit 96 from the output signal of the fourth coordinate transformation circuit 97. In this event, the modification signal circuit 84 may be similar to that illustrated in FIG. 15.

In FIG. 17, a divider circuit may be substituted for the subtractor 98 and is connected to a subtractor for subtracting unity from a divider output signal.

The amplitude signals $r_2$ and $r_4$ which are produced from the first and the third coordinate transformation circuits 91 and 96 (FIGS. 16 and 17) are equal to the output signal of the amplitude calculator 75. Therefore, each of the first and the third coordinate transformation circuits 91 and 96 may comprise an amplitude calculator similar to that illustrated in FIG. 11 and a phase calculator for calculating a phase component.

When the sampled signals given to the modulation circuit illustrated in FIG. 11 are expressed by the polar coordinate representation, the amplitude calculator 75 may be removed from the modulation system by supplying only an amplitude component to the random access memory 76.

The random access memory 76 illustrated in FIG. 11 is accessed only by a single factor, namely, an amplitude component of the baseband signal without any phase component thereof. Therefore, it is possible to remarkably reduce a memory capacity of the random access memory 76.

In addition, when the compensation signals stored in the random access memory 76 are expressed by the polar coordinate representation, the predistorted signals $G(a(t)+jb(t))$ can be calculated by addition of amplitude components and addition of phase components, as mentioned before. The addition of amplitude components may be replaced by multiplication of the amplitude components.

Referring to FIG. 18, a modulation system according to a fourth embodiment of this invention comprises similar parts designated by like reference numerals and is operable in response to an input signal IN which may be a sequence of digital signals similar to the input signal IN (FIG. 6). The input signal IN is therefore received at a symbol rate equal to the predetermined sampling rate determined for a baseband signal carried by the input signal IN. From this fact, it is readily understood that the input signal IN may be produced by sampling the system input signal SIN at the predetermined sampling rate in a sampling portion 51'. Each of the digital signals specifies N-levels and represents each of symbols. When the input signal is subjected to quadrature-phase modulation, the input signal is composed of an input in-phase component and an input quadrature phase component. Thus, the input signal is specified by two signal components, namely, amplitude and phase. The digital signals are successively stored in a shift register 101 at the symbol rate. The shift register 101 can store a prescribed number K of the symbols which is determined in consideration of a length of an impulse response of a band restriction filter used in the modification system.

The digital signals of the predetermined number are serially stored in the shift register 101 and are simultaneously delivered to a read-only memory 102 and a random access memory 103 in parallel as a single address signal for specifying each address of the read-only memory 102 and the random access memory 103.

A counter 105 is coupled to the read-only memory 102 and the random access memory 103 and is operable at a specific rate which is higher than the symbol rate. The specific rate may be equal, for example, to four times the predetermined sampling rate. Consequently, the counter 105 produces a sequence of counter output signals at the specific rate.

The read-only memory 102 is loaded with a sequence of symbols which is representative of a waveform shown by the solid line in FIG. 9 and which is derived at the specific rate. The symbols stored in the read-only memory 102 will be called a sequence of reference symbols.

On the other hand, the random access memory 103 is loaded with a sequence of predistorted signals which is for compensating for the nonlinearities of the amplifier 30 and which is given as a complex signal. The predistorted signal sequence is stored in the random access memory 103 and read out of the random access memory 103 at the specific rate. The predistorted signal sequence represents a waveform shown by a broken line in FIG. 9.

When the read-only memory 102 is supplied with each of the address signals from the shift register 101, a corresponding one of the reference signals is read out of the read-only memory 102 to be sent to a subtractor 63'. During each symbol interval of time, three succeeding reference signals are also read out of the read-only memory 102 after one of the reference signals is sent from the read-only memory 102 to the subtractor 63'. Thus, interpolation is carried out to produce four reference signals during each symbol interval.

Likewise, the random access memory 103 produces four predistorted signals in response to each of the address signals during each symbol interval of time. Thus, the predistorted signals are also interpolated during each symbol interval and subjected to modulation and amplification in the manner described before. A combination of the shift register 101, the counter 105, the read-only memory 102, and the random access memory 103 may be referred to as an interpolation circuit. The amplified output signal s'(t) is sent through the quadrature demodulator 61 and the analog-to-digital converter 62 to a subtractor 63' as the additional input signal. Such an additional input signal is given to the subtractor 63' at the specific rate.

The subtractor 63' subtracts the additional input signal from the reference signal sequence read out of the read-only memory 102 to produce a difference signal representative of a difference therebetween. The difference signal is delivered through the modification amount calculator 64 to the adder 66 to successively produce a sequence of write-in signals. As a result, the predistorted signals are adaptively updated by the write-in signals.

Figure 19:
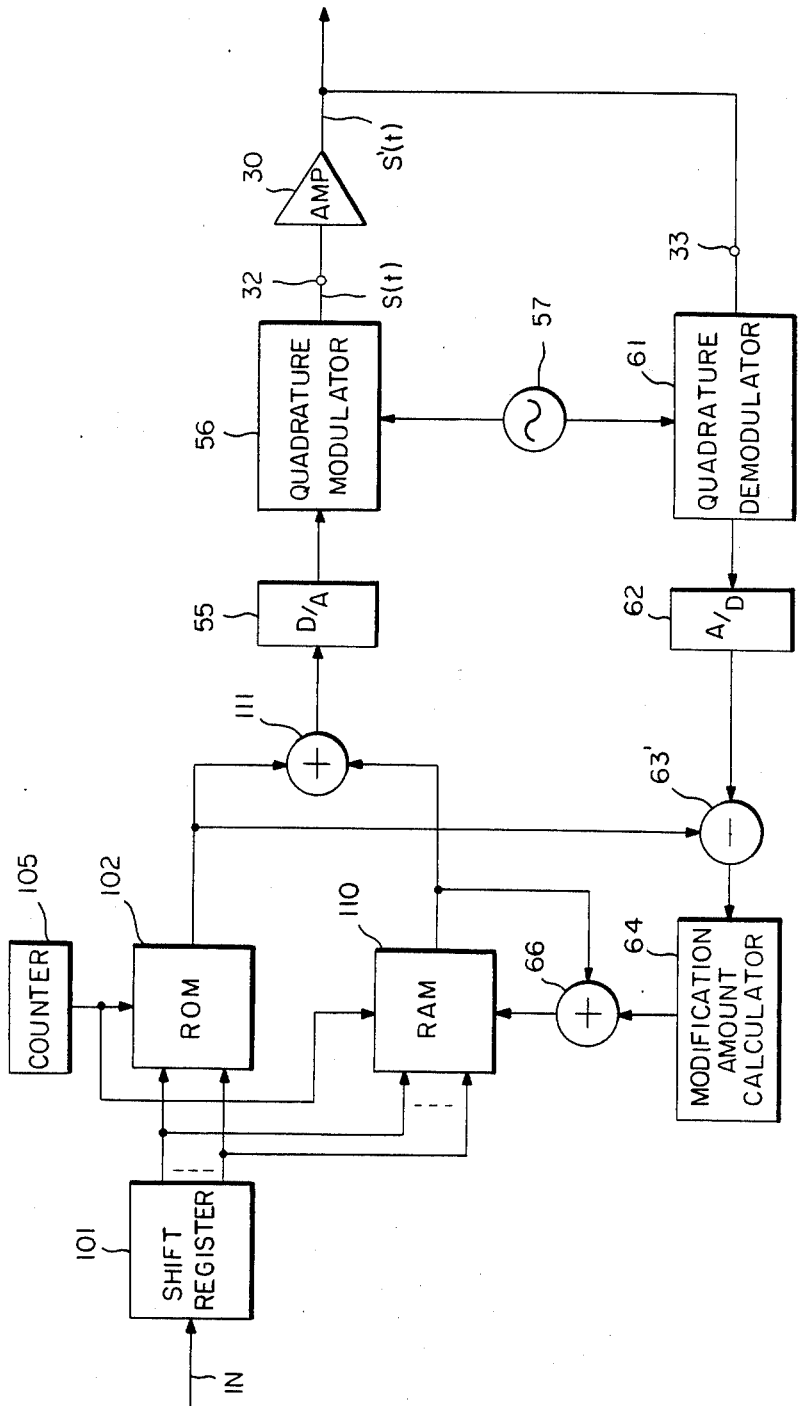
FIG. 19 is a block diagram of a modulation system according to a fifth embodiment of this invention.

Referring to FIG. 19, a modulation system according to a fifth embodiment of this invention is similar to that illustrated in FIG. 18 except that a random access memory 110 is loaded with a sequence of distortion components instead of the predistorted signals and an adder circuit 111 adds the distortion components to the reference signals read out of the read-only memory 102. The shift register 101 and the counter 105 are operated in the manner described with reference to FIG. 18. Accordingly, the read-only memory 102 and the random access memory 110 produce the reference signals and the distortion components at the specific rate. As a result, the adder circuit 111 calculates, at the specific rate, sums of the reference signals and the distortion components to produce a sequence of sum signals as the predistorted signals.

The distortion components stored in the random access memory 110 are adaptively renewed with reference to the additional input signal in the manner mentioned before.

Inasmuch as the distortion components are smaller in amplitude than the predistorted signals, the random access memory 110 illustrated in FIG. 18 may have a memory capacity smaller than that of the random access memory 103 (FIG. 18).

In addition, a subtractor may be substituted for the adder 66 when the subtractor 63' carries out subtraction of the reference signals from the additional input signal.

While this invention has thus far been described in conjunction with several embodiments thereof, it will readily be possible for those skilled in the art to put this invention into practice in various other ways. For example, this invention is applicable to any other digital modulation other than quadrature amplitude-phase modulation. The modification amount calculator 64 or the modification signal circuit 83 (FIG. 11) may comprise a circuit for holding a polarity of the output signal of the subtractor 63, 63', or the error detector 81 (FIG. 11) and a circuit for rendering the output signal into a constant small value. When a delay time is not negligible in a path between the digital-to-analog converter 55 and the analog-to-digital converter 62, a delay circuit may be connected before the subtractor 63 to delay the sampled signals or between the read-only memory 102 and the subtractor 63' (FIGS. 18 and 19). When the delay time is longer than a time determined by the specific rate, the sampled signals or input signals must also be delayed. In FIG. 12, the illustrated signal producing circuit 77 may be for use in combination with the random access memory 76 producing the distortion signals of the polar coordinate representation, if the signals $I_c$ and $Q_c$ are sent from coordinate transformation circuits for transforming polar coordinate representations into orthogonal coordinate representations. Likewise, the signal producing circuit 77 illustrated in FIG. 16 may be combined with the random access memory 76 for producing the output signals of the orthogonal coordinate representations when the signals $r_1$ and $\theta_1$ are supplied through a coordinate transformation circuit for transforming orthogonal coordinate representations into polar coordinate ones.

What is claimed is:

1. A modulation system responsive to a system input signal for supplying a modulated analog signal to an amplifier having nonlinearities said amplifier producing an amplified output signal, said system input signal conveying an information signal which has a predetermined sampling rate for reproduction, said modulation system comprising:
   pre-processing means responsive to said system input signal and an additional input signal for preliminarily processing said system input signal with reference to said additional input signal to compensate for said nonlinearities at a specific rate higher than said predetermined sampling rate and to produce a sequence of pre-processed signals;
   modulating means coupled to said pre-processing means for modulating said pre-processed signal sequence into said modulated analog signal;
   demodulating means responsive to said amplified output signal for demodulating said amplified output signal into a demodulated signal corresponding to said system input signal; and
   signal supplying means for supplying said demodulated signal to said pre-processing means as said additional input signal.

2. A modulation system as claimed in claim 1, wherein said information signal comprises a sequence of digital signals having a symbol rate equal to said predetermined sampling rate, wherein said signal supplying means comprises:
   conversion means responsive to said demodulated signal for converting said demodulated signal into a sequence of additional digital signals at said specific rate; and
   means for sending said additional digital signal sequence to said pre-processing means as said additional input signal.

3. A modulation system as claimed in claim 2, wherein said pre-processing means comprises:
   sampling means for sampling said system input signal at said specific rate to produce a sequence of sampled signals; and
   predistorting means responsive to said sampled signal sequence and said additional digital signal sequence for adaptively carrying out predistortion of said sampled signal sequence with reference to said additional input signal sequence and said nonlinearities at said specific rate to produce said pre-processed signal sequence.

4. A modulation system as claimed in claim 3, wherein said predistorting means comprises:
   first calculating means responsive to said sampled signal sequence and said additional input signal sequence for successively calculating differences between said sampled signals and said additional input signals at said specific rate to produce a sequence of difference signals representative of said differences; and
   second calculating means responsive to said sampled signal sequence and said difference signal sequence for adaptively calculating said pre-processed signal sequence.

5. A modulation system as claimed in claim 4, wherein said second calculating means comprises:
   storage means for storing predistorted signals compensating for said nonlinearities in one-to-one correspondence to each of said sampled signals to successively produce a selected one of said predistorted signals in response to a current one of said sampled signals as said pre-processed signals;
   modifying means responsive to said pre-processed signals and said difference signal sequence for adaptively modifying each of said pre-processed signals with reference to each of said difference signals to produce a sequence of modified signals; and
   means for supplying said modified signals as said predistorted signals to said storage means.

6. A modulation system as claimed in claim 4, wherein said second calculating means comprises:
   memory means for memorizing distortion components compensating for said nonlinearities in one-to-one correspondence to each of said sampled signals to successively produce a current one of said distortion components in response to a current one of said sampled signals;

adding means for adding said current one of the sampled signals to said current one of the distortion components to produce as a current one of said predistorted signals a sum signal representative of a sum of said current one of the sampled signals and said current one of the distortion components; and modifying means coupled to said memory means and said first calculating means for adaptively modifying said current one of the distortion components with reference to a current one of said difference signals.

7. A modulation system as claimed in claim 6, wherein said memory means comprises:

amplitude calculating means responsive to said current one of the sampled signals for calculating an amplitude of said information signal to produce an amplitude signal representative of said amplitude; and a memory accessed by said amplitude signal for successively producing said current one of the distortion components in one-to-one correspondence to said amplitude signal.

8. A modulation system as claimed in claim 1, wherein said information signal is an analog signal which is reproducible by sampling said analog signal at said predetermined rate.

9. A modulation system as claimed in claim 1, wherein said information signal comprises a sequence of digital signals having a symbol rate equal to said predetermined sampling rate, and wherein said pre-processing means comprises:

sample means for sampling said system input signal at said symbol rate to produce a sequence of sampled signals;

predistortion means responsive to said sampled signal sequence and said additional input signal sequence for adaptively predistorting said sampled signal sequence with reference to said additional input signal to produce said pre-processed signal sequence by carrying out interpolation in relation to said sampled signal sequence at said specific rate, said predistortion means producing said pre-processed signal sequence.

10. A modulation system as claimed in claim 9, wherein said predistortion means comprises:

interpolating means responsive to said sampled signal sequence for interpolating each of said sampled signals at said specific rate to produce a sequence of interpolated signals as said pre-processed signal sequence at said specific rate; and renewing means responsive to said additional input signal and coupled to said interpolating means for adaptively renewing said interpolated signals at said specific rate.

11. A modulation system as claimed in claim 10, wherein said interpolating means comprises:

storage means for storing a preselected number of said sampled signals;

a counter for producing a sequence of counter output signals at said specific rate;

reference signal producing means coupled to said storage means and said counter for producing a sequence of reference signals at said specific rate with reference to said preselected number of the sampled signals;

interpolated signal producing means coupled to said storage means, said counter, and said renewing means for adaptively producing said interpolated signal sequence at said specific rate; and means for producing said interpolated signal sequence as said pre-processed signal sequence.

12. A modulation system as claimed in claim 10, wherein said interpolating means comprises:

storage means for storing a preselected number of said sampled signals;

a counter for producing a sequence of counter output signals at said specific rate;

reference signal producing means coupled to said storage means and said counter for producing a sequence of reference signals at said specific rate with reference to said preselected number of the sampled signals;

a random access memory coupled to said storage means, said counter, and said renewing means for adaptively storing a sequence of distortion components corresponding to said nonlinearities to produce said distortion components at said specific rate in response to said preselected number of the sampled signals;

means for calculating said reference signals and said distortion components at said specific rate to produce results of calculation as said interpolated signals; and means for producing said interpolated signals as said pre-processed signals.

13. A modulation system for use in combination with an amplifier having nonlinearities to supply said amplifier with a modulated analog signal in response to a sequence of digital signals having a predetermined symbol rate, said amplifier producing an amplified output signal in response to said modulated analog signal, said modulation system comprising:

interpolating means for interpolating each of said digital signals at a specific rate higher than said predetermined symbol rate to produce a sequence of interpolated signals at said specific rate, said interpolated signal sequence being for compensating for said nonlinearities;

modulating means coupled to said interpolating means for modulating said interpolated signal sequence into said modulated analog signal;

demodulating means for demodulating said amplified output signal into a demodulated signal corresponding to said digital signal sequence; and renewing means coupled to said demodulating means and said interpolating means and responsive to said digital signal sequence for adaptively renewing said interpolated signal sequence at said specific rate with reference to said demodulated signal and said digital signal sequence.

* * * * *